(12) United States Patent
Liu

(10) Patent No.: US 7,474,718 B2
(45) Date of Patent: Jan. 6, 2009

(54) FREQUENCY CONTROL FOR A MOBILE COMMUNICATIONS DEVICE

(75) Inventor: Hong Liu, Værløse (DK)

(73) Assignee: Nokia Corporation, Espoo (FI)

( * ) Notice: Subject to any disclaimer, the term of this patent is extended or adjusted under 35 U.S.C. 154(b) by 714 days.

(21) Appl. No.: 10/748,598

(22) Filed: Dec. 30, 2003

(65) Prior Publication Data

US 2005/0147188 A1 Jul. 7, 2005

(51) Int. Cl.
*H04L 27/06* (2006.01)
(52) U.S. Cl. .................. 375/344; 375/326; 375/327; 375/343; 375/362; 370/514
(58) Field of Classification Search ................ 375/344, 375/326, 327, 343, 365, 362; 370/514
See application file for complete search history.

(56) References Cited

U.S. PATENT DOCUMENTS

| 5,276,706 A | 1/1994 | Critchlow et al. |
| 6,728,326 B1 * | 4/2004 | Fulghum ................... 375/365 |
| 7,203,254 B2 * | 4/2007 | Carsello et al. ............. 375/334 |

| 2002/1816151 | 12/2002 | Alexander et al. |

FOREIGN PATENT DOCUMENTS

| EP | 0959568 A | 11/1999 |
| GB | 2320628 A | 6/1998 |
| WO | 03/030400 A | 4/2003 |

OTHER PUBLICATIONS

Marco Luise, et al., "Carrier Frequency Recovery In All-Digital Modems For Burst-Mode Transmissions", IEEE Transactions on Communications, vol. 43, No. 2/3/4, 1995, pp. 1169-1178.
Huang, Y-L, et al., "A Fully Digital Noncoherent And Coherent GMSK Receiver Architecture With Joint Symbol Timing Error And Frequency Offset Estimation", IEEE Transactions On Vehicular Technology, IEEE Inc., New York, US, vol. 49, No. 3, May 2000, pp. 863-874.
Luise, M, et al., "An Efficient Carrier Frequency Recovery Scheme For GSM Receivers", Communication for Global Users, IEEE, New York, US, vol. Mini Conference, Dec. 6, 1992, pp. 36040.
International Search Report dated Mar. 17, 2005.

* cited by examiner

*Primary Examiner*—Phuong Phu
(74) *Attorney, Agent, or Firm*—Perman & Green, LLP

(57) ABSTRACT

A mobile station in a TDMA network can perform automatic frequency using burst in all or any slot in a control channel. This is achieved by identifying the training sequence of an arbitrary set of or all received bursts.

29 Claims, 4 Drawing Sheets

FREQUENCY CONTROL FOR A MOBILE COMMUNICATIONS DEVICE

FIELD OF THE INVENTION

The present invention relates to a mobile communication device.

BACKGROUND TO THE INVENTION

Mobile communication networks typically comprise a plurality of base stations and a plurality of mobile stations. In order for the mobile stations to communicate effectively with the base stations, they must be tuned precisely to the frequencies used by the base stations. In the case of GSM, the tolerance for traffic mode operation is 0.1 ppm.

Although crystal-controlled reference oscillators are used in the mobile stations, tuning errors can be significant. Indeed, when a mobile station is in sleep mode, the local oscillator drift could be up to 500 Hz in the 900 MHz band, chiefly due to temperature effects and mis-setting. Additional, frequency errors can arise due to drift of the base station's oscillators and Doppler shift.

Consequently, the base stations transmit frequency correction signals.

In GSM (Global System for Mobile Communications) and similar systems, the frequency correction signal comprises a frequency control channel (FCCH) which the mobile station uses when it is powered up.

When a mobile station initiates a connection, such as "Push to Talk" or WAP, the mobile station must already be on. For such a mobile station initiated connection, the mobile station will be configured in ALL_(P)CCCHmode.

The problem of synchronising with the base station arises when the uplink connection is initiated by the mobile station and the mobile station is configured to ALL_(P)CCCH. The worst case is that the mobile station is configured to combined BCCH/CCCH/SDCCH/SACCH, where 4 block periods (one block is 4 bursts) are used by BCCH and CCCH and 6 block periods are reserved for SDCCH and SACCH in the 51-multiframe. This means only 4 blocks (16 bursts) from the BCCH and the CCCH are available for AFC (automatic frequency correction). Therefore, it takes long time for AFC to adjust the frequency offset to less than 0.1 ppm. Furthermore, the conventional AFC uses only the bursts available in TS0 (time slot 0).

SUMMARY OF THE INVENTION

It is an aim of the present invention to reduce the time required for performing a frequency correction by using a predefined portion, e.g. training sequences, of arbitrary or any bursts to obtain a channel estimate and a signal to noise ratio value to be used in frequency error determination.

According to the present invention, there is provided a mobile station for a communications network in which data is transmitted in bursts including training sequences, the station comprising:
an rf front end including a mixer;
a frequency synthesizer for generating a local oscillator signal for said mixer, the frequency synthesizer including an electronically tunable reference oscillator;
a burst training sequence identifying means for generating a training sequence identifying signal; and
frequency correction signal generating means for generating a control signal for tuning said reference oscillator in dependence on said training sequence identifying signal so as to correct an error in the frequency of said reference oscillator.

The burst training sequence identifying means may comprise correlator means for determining a correlation value for part of a burst and each of a plurality of training sequences and identifying the burst training sequence according to the largest correlation value. The correlator means may be configured such that, for each of said training sequences, it repeatedly cross-correlates a part of the training sequence part of a burst with a training sequence, moving said part of the training sequence part of a burst relative to said train sequence between cross-correlations. Alternatively, the correlator means may be configured such that, for each of said training sequences, it repeatedly cross-correlate a part of a burst, longer than the training sequence part of the burst, with a training sequence, moving training sequences relative to said part of a burst between cross-correlations.

The mobile station may include control means for tuning the mobile station to a control channel frequency to receive control channel bursts and the burst training sequence identifying means is configured to identify the training sequences of the bursts of said control channel.

The burst training sequence identifying means may be configured to identify the training sequences of the bursts in a plurality of slots of a TDMA frame. The slots may be contiguous, for example all of the slots of a frame. In the context of a GSM-type system, the present invention enables the use of bursts in every time slot (TS0 TS1 . . . TS7) of every frame (frame 0 . . . frame 50).

According to the present invention, there is provided a method of performing frequency correction in a mobile station for a communications network in which data is transmitted in bursts including training sequences, the method comprising:
receiving a burst;
identifying the training sequence in the burst;
generating a tuning control signal in dependence on said training sequence identifying signal; and
applying the tuning control signal to a tunable reference oscillator in a frequency synthesizer that provides a local oscillator signal to a front end mixer.

Identifying the burst training sequence may comprise cross-correlating a part of a burst and a plurality of training sequences. The cross-correlating may comprise, for each of said training sequences, repeatedly cross-correlating a part of the training sequence part of a burst with a training sequence, moving said part of the training sequence part of a burst relative to said train sequence between cross-correlations. Alternatively, the cross-correlating may comprise, for each of said training sequences, repeatedly cross-correlating a part of a burst, greater than the training sequence part of the burst, with a training sequence, moving training sequences relative to said part of a burst between cross-correlations.

The method may comprises tuning the mobile station to a control channel frequency, wherein the received burst is a control channel burst. The training sequences used in said cross-correlating may be the training sequences of the bursts in a plurality of slots of a TDMA frame. Said slots may be contiguous, e.g. all of the slots of a frame.

DETAILED DESCRIPTION OF EMBODIMENTS

Embodiments of the present invention will now be described, by way of example, with reference to the accompanying drawings.

Figure 1:
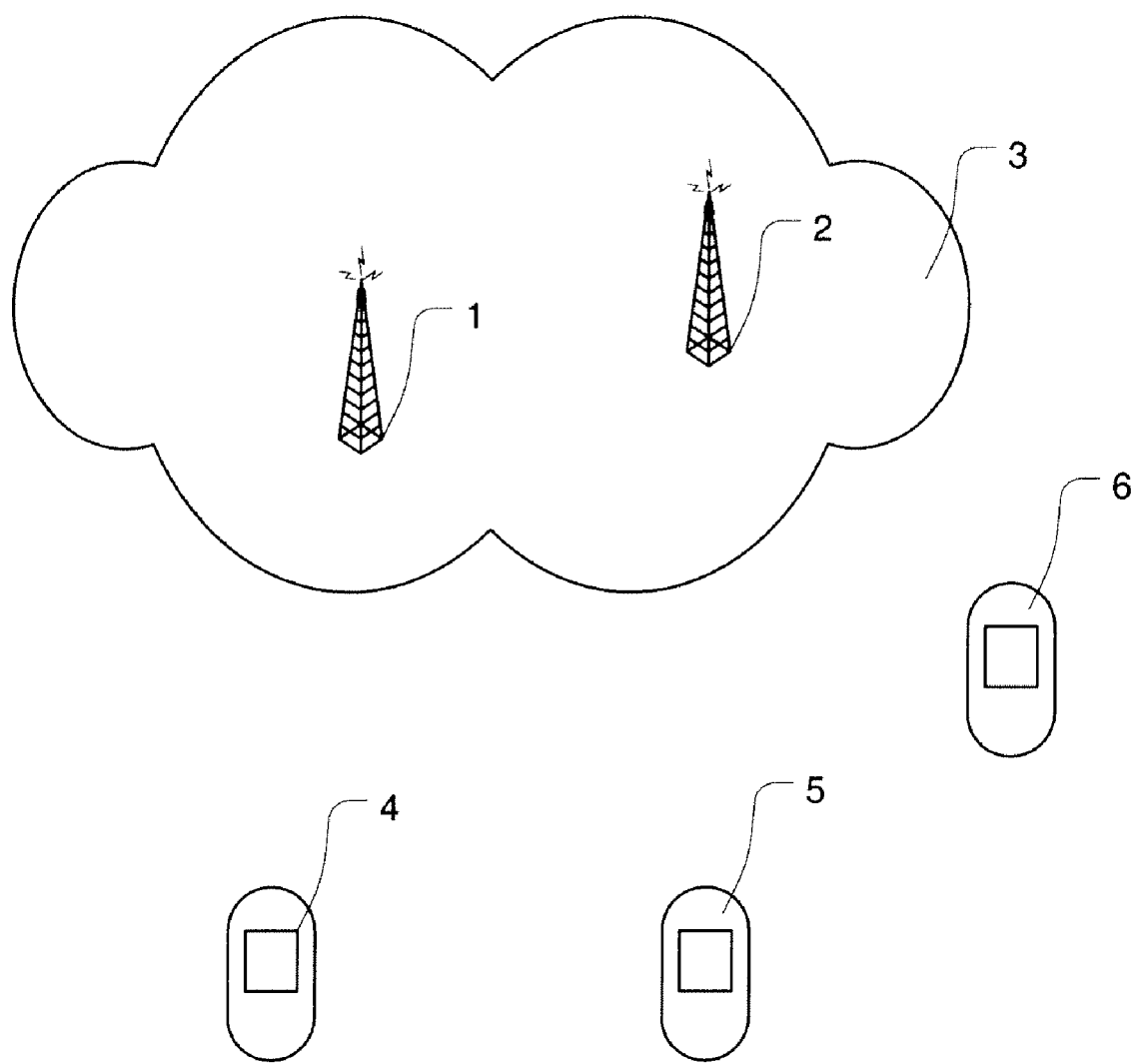
FIG. 1 shows the major components of a first exemplary system embodying the present invention.

Referring to FIG. 1, the first exemplary system comprises a plurality of base transceiver sites (BTS), only first and second BTSs 1, 2 shown, connected into a cellular mobile phone network 3. A plurality mobile stations, e.g. mobile phones 4, 5, 6, can communicate with mobile and fixed stations via the BTSs 1, 2.

The BTSs 1, 2 transmit broadcast control signals including a broadcast control channel (BCCH and, optionally, (P)CCCH), a standalone dedicated control channel (SDCCH) and optionally a slow associated control channel (SACCH). The BCCH only has normal bursts. The SDCCH and SACCH comprises normal bursts and dummy bursts. Other time slots (e.g. TS1, TS2., TS7) may comprises normal bursts or dummy bursts with different modulation types, eg. GMSK and 8PSK in EDGE.

Normal bursts comprise 57 data symbols and one stealing symbol on either side of a 26 symbol training sequence "mid-amble". Dummy bursts are similar to the normal bursts but always have the same form which is predefined. Eight different training sequences are used for normal bursts and a ninth "training sequence" is used for dummy bursts. Since the dummy bursts are predefined, any part of a dummy sequence can fulfil the role of a training sequence for the purposes of the present invention.

Figure 2:
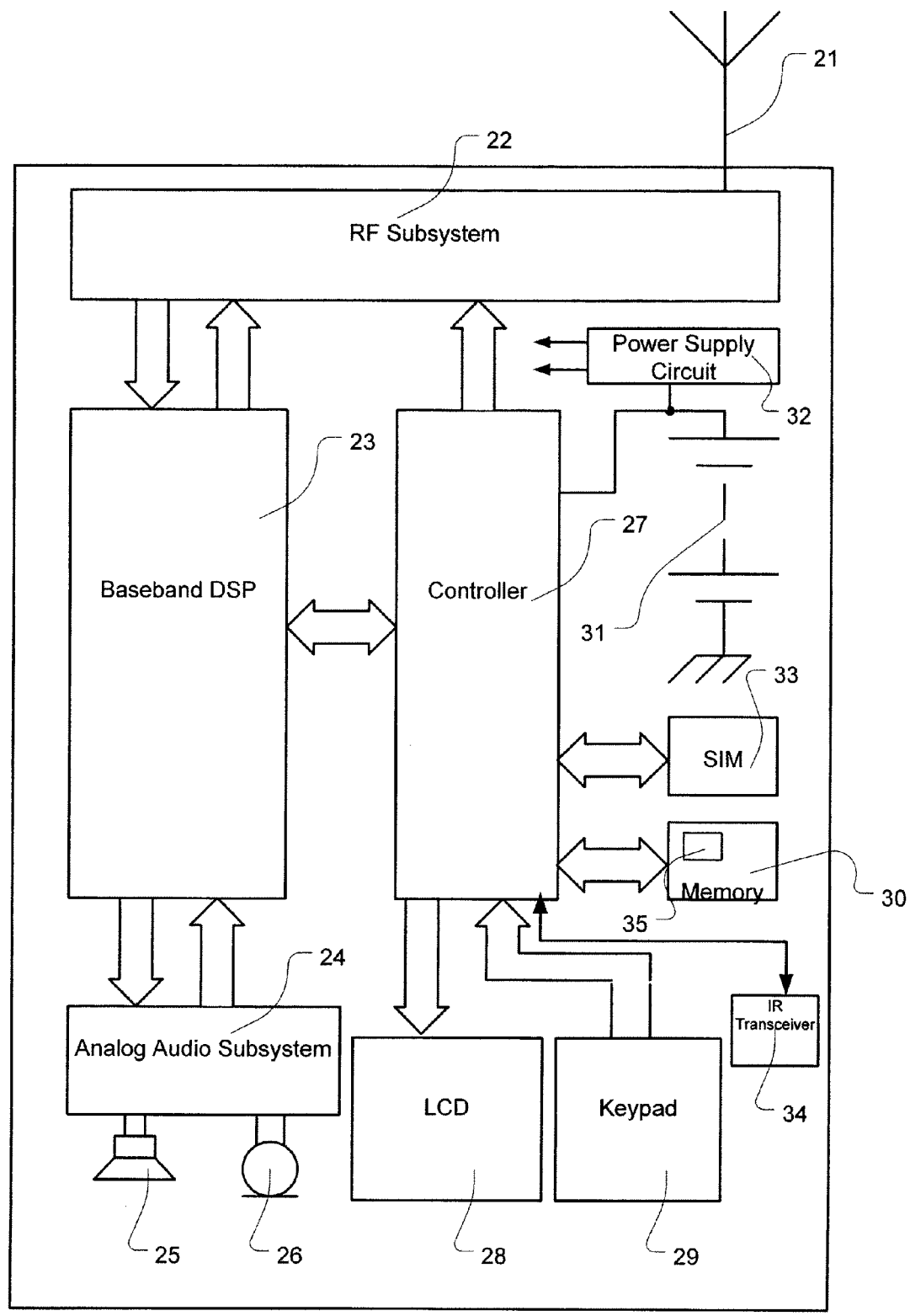
FIG. 2 is a block diagram of the mobile phone of FIG. 1.

Referring to FIG. 2, the first mobile phone 4 comprises an antenna 21, an rf subsystem 22, a baseband DSP (digital signal processing) subsystem 23, an analog audio subsystem 24, a loudspeaker 25, a microphone 26, a controller 27, a liquid crystal display 28, a keypad 29, memory 30, a battery 31, a power supply circuit 32 and a SIM (subscriber identity module) 33 and an infrared transceiver 34.

The rf subsystem 22 contains the rf circuits of the mobile phone's transmitter and receiver and a frequency synthesizer for tuning the mobile phone's transmitter and receiver. The frequency synthesizer include a variable crystal oscillator which provides a reference for the generation of other frequencies within the frequency synthesizer. The antenna 21 is coupled to the rf subsystem 22 for the reception and transmission of radio waves.

The baseband DSP subsystem 23 is coupled to the rf subsystem 22 to receive baseband signals therefrom and for sending baseband modulation signals thereto. The baseband DSP subsystems 23 includes codec functions which are well-known in the art. The baseband DSP subsystem 23 also generates a frequency correction signal that is fed to the frequency synthesizer to control the frequency of the reference oscillator. This process will be described in more detail below.

The analog audio subsystem 24 is coupled to the baseband DSP subsystem 23 and receives demodulated audio therefrom. The analog audio subsystem 24 amplifies the demodulated audio and applies it to the loudspeaker 25. Acoustic signals, detected by the microphone 26, are pre-amplified by the analog audio subsystem 24 and sent to the baseband DSP subsystem 24 for coding.

The controller 27 controls the operation of the mobile phone 2. To this end, it is coupled to the rf subsystem 22 for supplying tuning instructions to the frequency synthesizer and to the baseband DSP subsystem for supplying control data and management data for transmission. The controller 27 operates according to a program stored in the memory 30 with reference to the contents of the SIM 33. The memory 30 is shown separately from the controller 27. However, it may be integrated with the controller 27.

The display device 28 is connected to the controller 27 for receiving control data and the keypad 29 is connected to the controller 27 for supplying user input data signals thereto.

Figure 3:
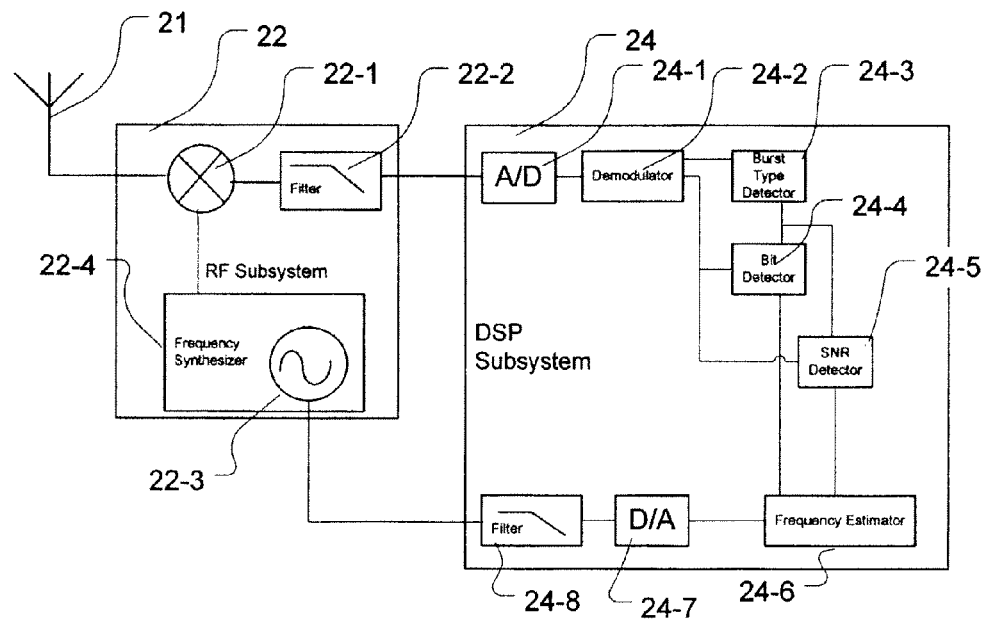
FIG. 3 is a functional block diagram of those aspects of the mobile phone of FIG. 3 which are concerned with frequency control.

Referring to FIG. 3, signals received by the antenna 21 are downconverted to baseband by a mixer 22-1 in the rf subsystem 22. The baseband output of the mixer 22-1 is filtered by a filter 22-2, also comprised in the rf module 22.

The filtered baseband signal is fed to the baseband DSP subsystem 24, where it is digitized by an analog-to-digital converted 24-1 and demodulated by a demodulator 24-2.

The demodulated signal is fed to a burst type detector 24-3, a bit detector 24-4 and a signal-to-noise ratio (SNR) detector 24-5, all of which are comprised in the baseband DSP subsystem 24.

Figure 4:
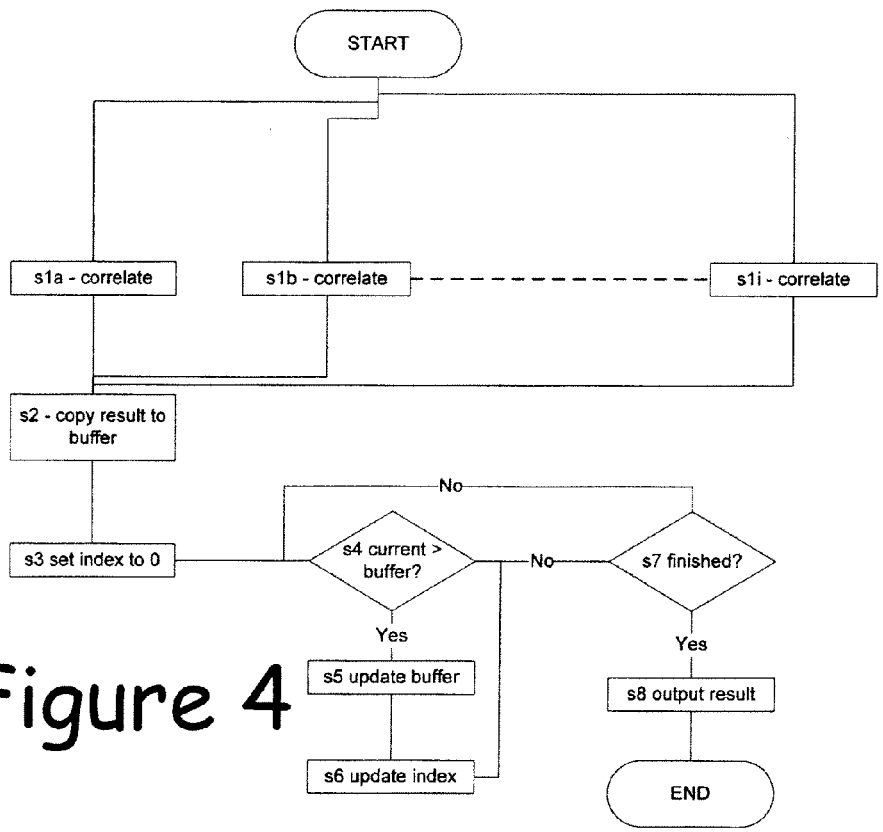
FIG. 4 is a flowchart illustrating the operation of a first burst type detector.

Referring to FIG. 4, the burst type detector 24-3 correlates (steps s1$a$, . . . , s1$i$) the 26 mid-amble symbols of the current burst with each of the nine training sequences used by the BTSs 1, 2 (FIG. 1). The correlations may be performed sequentially or in parallel as shown in FIG. 4. When the correlations (steps s1$a$, . . . , s1$i$) have been completed, the result of the first correlation (step s1$a$) is copied to a buffer (step s2) and a index is set to 0 (step s3). Then, the results of the second to ninth correlations are sequentially compared with the value in the buffer (step s4). If the value in the buffer is less than the currently selected correlation result, the value in the buffer is replaced by the correlation result (step s5) and the index is updated to identify the training sequence corresponding to the correlation result (step s6). When all of the second to ninth correlation results have been compared (step s7), the index is output to indicate the training sequence of the current burst (step s8).

Referring back to FIG. 3, the training sequence index from the burst type detector 24-3 is supplied to the bit detector 24-4 and the SNR estimator 24-5.

The outputs of the bit detector 24-4 and the SNR estimator 24-5 are supplied to a frequency estimator 24-6 which estimates the tuning error and outputs a digital correction signal.

The bit detector 24-4 includes a channel estimator and an equalizer. The channel estimate includes a timing estimate which is an estimate of when the burst starts. The channel estimator uses the burst type output from the burst type detector 24-3 to select the training sequence to be used for channel estimation.

The operation of the frequency estimator 24-6 will now be described in the case where the demodulator 24-2 uses a matched filter for demodulation.

In every burst an average is done over 32 pairs of samples. The members of each pair come from respective ends of the burst. The distance between each pair of samples is $N=N_2-N_1=110$, and the first used sample is sample 2.

The phase shift between the members of the first pair of samples is calculated using:

$$\varphi_i = \varphi_2 - \varphi_1 = \arctan\left(\frac{Im_2}{Re_2}\right) - \arctan\left(\frac{Im_1}{Re_1}\right)$$

where $Im_2$ and $Re_2$ are the I, Q values from the first sample of the first 32 samples (i.e. No. 2 sample), and $Im_1$ and $Re_1$ are the I, Q values from the first sample of the second 32 samples (i.e. sample 112). This operation is repeated for all 32 pairs of samples and then averaged over 32 in accordance with:

$$\varphi = \sum_{i=1}^{32} \varphi_i / 32$$

Then the estimated frequency offset is obtained in accordance with:

$$\Delta f = \frac{\varphi}{2\pi T_b (N_2 - N_1)}$$

where $T_b$ is the sample rate, i.e. 270833.33 Hz.

The SNR estimator 24-5 the demodulated signal to estimate the SNR of the signal for each burst. For example using the knowledge of the training sequence identified by the burst type detector 24-3 to calculate the mean and variance of the demodulated training sequence and then get the SNR. If the known training sequence is train(i) and demodulated training sequence is deTrain(i) and the known train sequence 26 samples values can be either '0' and '1'. These are represented as −1 and 1 respectively and the average value is calculated in accordance with:

$$\text{mean} = \frac{-\sum_{i=0}^{25} \text{train}(i) * \text{deTrain}(i)}{26}$$

The variance is calculated in accordance with:

$$\text{var} = \frac{\sum_{i=0}^{25} (\text{deTrain}(i) + \text{train}(i) * \text{mean})^2}{26}$$

The SNR is calculated in accordance with:

$$SNR = \frac{\text{mean}^2}{\text{var}}$$

The digital correction signal is converted into an analog signal by a digital-to-analog converter 24-7. The analog correction signal is filtered by a low-pass filter 24-8 and the output of the filter 24-8 is applied as a control signal to the variable crystal oscillator 22-3 that provides the frequency reference for the frequency synthesizer 22-4 of the rf module 22.

Figure 5:
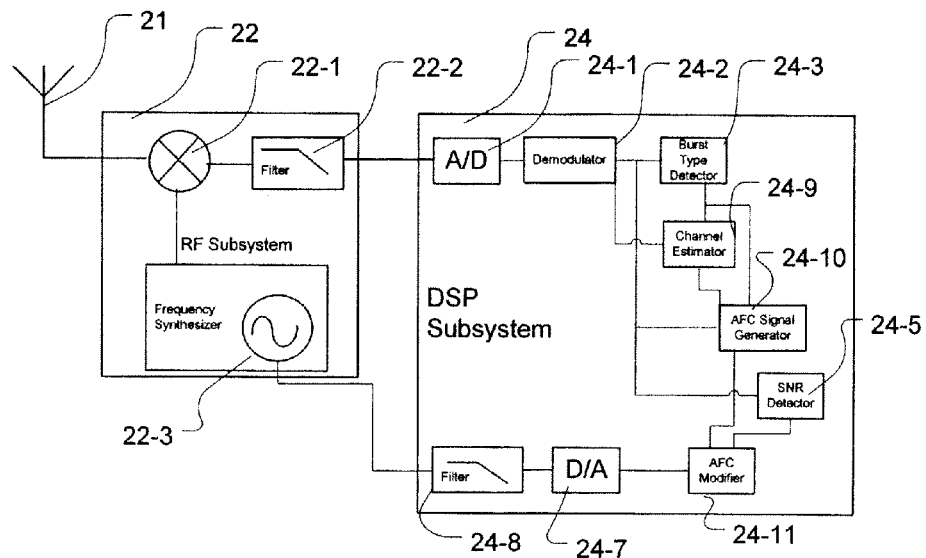
FIG. 5 is a functional block diagram of the frequency control related aspects of another mobile phone.

Referring to FIG. 5, in an alternative configuration of the mobile phone of FIG. 3, signals received by the antenna 21 are downconverted to baseband by a mixer 22-1 in the rf subsystem 22. The baseband output of the mixer 22-1 is filtered by a filter 22-2, also comprised in the rf module 22.

The filtered baseband signal is fed to the baseband DSP subsystem 24, where it is digitized by an analog-to-digital converted 24-1 and demodulated by a demodulator 24-2.

The demodulated signal is fed to a burst type detector 24-3, a channel estimator 24-9, an AFC signal generator 24-10 and a signal-to-noise ratio (SNR) detector 24-5, all of which are comprised in the baseband DSP subsystem 24.

The AFC signal generator 24-10 uses the algorithm is described in Marco Luise & Ruggero Regiannini, "Carrier Frequency Recovery in All-Digital Modems for Burst-Mode Transmission", IEEE Trans. Comm, vol. 43, No. 2/3/4, 1995.

The burst mode detector 24-3 operates as described above with reference to FIG. 4.

Referring back to FIG. 5, the training sequence index from the burst type detector 24-3 is supplied to the channel estimator 24-9, the AFC signal generator 24-10 and the SNR estimator 24-5. The output of the channel estimator 24-9 is also supplied to the AFC signal generator 24-10.

The outputs of the AFC signal generator 24-10 and the SNR estimator 24-5 are supplied to an AFC modifier 24-11 which produces a modified digital correction signal. The digital correction signal is converted into an analog signal by a digital-to-analog converter 24-7. The analog correction signal is filtered by a low-pass filter 24-8 and the output of the filter 24-8 is applied as a control signal to the variable crystal oscillator 22-3 that provides the frequency reference for the frequency synthesizer of the rf module 22.

Figure 6:
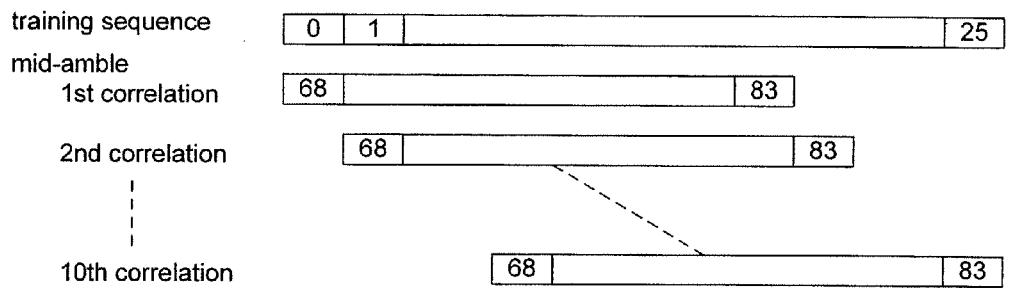
FIG. 6 illustrates a first correlation process.
Figure 7:
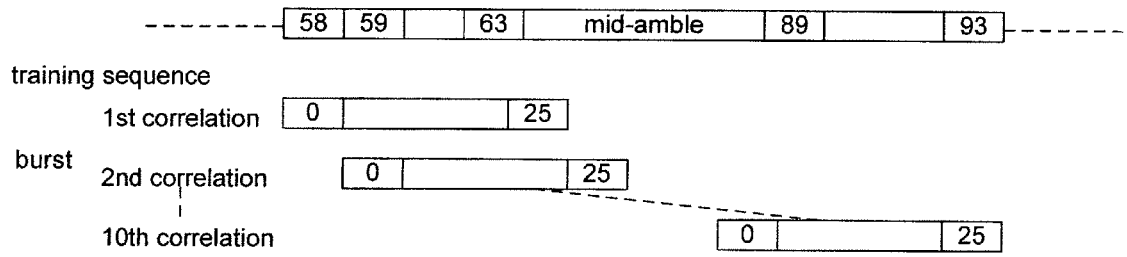
FIG. 7 illustrates a second correlation process.

There are two preferred techniques for the performance of the correlation steps s1a, . . . , s1i (FIG. 4). In one method, illustrated in FIG. 6, the 16 central symbols of the mid-amble are slid past the whole of a training sequence. In the other method, illustrated in FIG. 7, the training sequence is slid past the burst starting with the first symbol of the training sequence aligned with symbol 58 of the received burst and ending with the last symbol of the training sequence aligned with symbol 93 of the received burst. The cross-correlation between the burst and the sequence or subsequence is calculated for each relative position and the highest cross-correlation value is output to the process (steps s2 to s7 in FIG. 4) for identifying the training sequence best matched by the mid-amble of the burst.

It will be appreciated that there are many more embodiments of the present invention. For example, the embodiments described above may be used in addition to, rather than instead of, a dedicated frequency correction channel. The training sequence need not be contained in a mid-amble and may be located in other positions in a burst and only one training sequence may be used, rather than a plurality as described above.

Furthermore, burst other than control channel bursts may be used.

The particular frequency error determination process may vary from those described above. The present invention is primarily concerned with using known burst content for determining a channel estimate and/or a SNR value or other information which is then used for frequency error determination and frequency correction.

What is claimed is:

1. A mobile station comprising:
   an rf front end configured to receive data in bursts including training sequences, the rf front end including a mixer;
   a frequency synthesizer for generating a local oscillator signal for said mixer, the frequency synthesizer including an electronically tunable reference oscillator;

a burst training sequence identifier configured to identify the training sequences of the bursts in a plurality of slots of a TDMA frame and generate a training sequence identifying signal; and a frequency correction signal generator for generating a control signal for tuning said reference oscillator in dependence on said training sequence identifying signal so as to correct an error in the frequency of said reference oscillator, the frequency correction signal generator operating upon a pair of samples of one of said bursts, wherein one sample of said pair of samples of said burst is distant from a second sample of said pair of samples.

2. A mobile station according to claim 1, wherein the burst training sequence identifier comprises a correlator for determining a correlation value for part of a burst and each of a plurality of training sequences and identifying the burst training sequence according to the largest correlation value.

3. A mobile station according to claim 2, wherein the correlator is configured, for each of said training sequences, to repeatedly cross-correlate a part of the training sequence part of a burst with a training sequence, moving said part of the training sequence part of a burst relative to said train sequence between cross-correlations.

4. A mobile station according to claim 2, wherein the correlator is configured, for each of said training sequences, to repeatedly cross-correlate a part of a burst, greater than the training sequence part of the burst, with a training sequence, moving training sequences relative to said part of a burst between cross-correlations.

5. A mobile station according to claim 1, including a controller for tuning the mobile station to a control channel frequency to receive control channel bursts and wherein the burst training sequence identifier means is configured to identify the training sequences of the bursts of said control channel.

6. A mobile station according to claim 1, wherein said slots are contiguous.

7. A mobile station according to claim 6, wherein said slots are all of the slots of a frame.

8. A mobile station comprising:
an rf front end configured to receive data in bursts including training sequences, the rf front end including a mixer;
a frequency synthesizer for generating for generating a local oscillator signal for said mixer, the frequency synthesizer including an electronically tunable reference oscillator;
a burst training sequence identifier configured to identify the training sequences of the bursts in a plurality of slots of a TDMA frame and generate a training sequence identifying signal; and
a frequency correction signal generator for generating a control signal for tuning said reference oscillator in dependence on said training sequence identifying signal so as to correct an error in the frequency of said reference oscillator, the frequency correction signal generator operating upon a pair of samples of one of said bursts, wherein one sample of said pair of samples of said burst is distant from a second sample of said pair of samples, wherein the burst training sequence identifying means comprises correlator for determining a correlation value for part of a burst and each of a plurality of training sequences and identifying the burst training sequence according to the largest correlation value.

9. A mobile station according to claim 8, wherein the correlator means is configured, for each of said training sequences, to repeatedly cross-correlate a part of the training sequence part of a burst with a training sequence, moving said part of the training sequence part of a burst relative to said training sequence between cross-correlations.

10. A mobile station according to claim 8, wherein the correlator is configured, for each of said training sequences, to repeatedly cross-correlate a part of a burst, greater than the training sequence part of the burst, with a training sequence, moving training sequences relative to said part of a burst between cross-correlations.

11. A mobile station comprising:
an rf front end configured to receive data in bursts including training sequences, the rf front end including a mixer;
a frequency synthesizer for generating for generating a local oscillator signal for said mixer, the frequency synthesizer including an electronically tunable reference oscillator;
a controller means for tuning the mobile station to a control channel frequency to receive control channel bursts;
a burst training sequence identifier configured to identify the training sequences of the bursts in a plurality of slots of a TDMA frame and generate a training sequence identifying signal; and
a frequency correction signal generator for generating a control signal for tuning said reference oscillator in dependence on said training sequence identifying signal so as to correct an error in the frequency of said reference oscillator, the frequency correction signal generator operating upon a pair of samples of one of said bursts, wherein one sample of said pair of samples of said burst is distant from a second sample of said pair of samples, wherein the burst training sequence identifier is configured to identify the training sequences of the bursts of said control channel.

12. A mobile station for a communications network in which data is transmitted in bursts including training sequences, the station comprising:
an rf front end including a mixer;
a frequency synthesizer for generating for generating a local oscillator signal for said mixer, the frequency synthesizer including an electronically tunable reference oscillator;
a burst training sequence identifying means for generating a training sequence identifying signal; and
a frequency correction signal generator for generating a control signal for tuning said reference oscillator in dependence on said training sequence identifying signal so as to correct an error in the frequency of said reference oscillator, the frequency correction signal generator operating upon a pair of samples of one of said bursts, wherein one sample of said pair of samples of said burst is distant from a second sample of said pair of samples, wherein the burst training sequence identifying means is configured to identify the training sequences of the bursts in a plurality of slots of a TDMA frame.

13. A mobile station according to claim 12, wherein said slots are contiguous.

14. A mobile station according to claim 13, wherein said slots are all of the slots of a frame.

15. A method comprising:
receiving bursts of data including training sequences at a mobile station;
identifying the training sequences in the bursts in a plurality of slots of a TDMA frame and generating a training sequence identifying signal;
generating a tuning control signal in dependence on said training sequence identifying signal; the generating of the tuning control signal including operating upon a pair of samples of one of said bursts, wherein one sample of said pair of samples of said burst is distant from a second sample of said pair of samples, and applying the tuning control signal to a tunable reference oscillator in a frequency synthesizer that provides a local oscillator signal to a front end mixer to perform frequency correction.

16. A method according to claim 15, wherein identifying the burst training sequence comprises cross-correlating a part of a burst and a plurality of training sequences.

17. A method according to claim 16, wherein the cross-correlating comprises, for each of said training sequences, repeatedly cross-correlating a part of the training sequence part of a burst with a training sequence, moving said part of the training sequence part of a burst relative to said train sequence between cross-correlations.

18. A method according to claim 16, wherein the cross-correlating comprises, for each of said training sequences, repeatedly cross-correlating a part of a burst, greater than the training sequence part of the burst, with a training sequence, moving training sequences relative to said part of a burst between cross-correlations.

19. A method according to claim 15, including tuning the mobile station to a control channel frequency, wherein the received burst is a control channel burst.

20. A method according to claim 15, wherein said slots are contiguous.

21. A method according to claim 20, wherein said slots are all of the slots of a frame.

22. A method comprising:
receiving bursts of data including training sequences at a mobile station;
identifying training sequences of the bursts in a plurality of slots of a TDMA frame and generating a training sequence identifying signal;
generating a tuning control signal in dependence on said training sequence identifying signal, the generating of the tuning control signal including operating upon a pair of samples of one of said bursts, wherein one sample of said pair of samples of said burst is distant from a second sample of said pair of samples; and
applying the tuning control signal to a tunable reference oscillator in a frequency synthesizer that provides a local oscillator signal to a front end mixer to perform frequency control,
wherein identifying the burst training sequence comprises cross-correlating a part of a burst and a plurality of training sequences of the bursts in the plurality of slots of the TDMA frame.

23. A method according to claim 22, wherein the cross-correlating comprises, for each of said training sequences, repeatedly cross-correlating a part of the training sequence part of a burst with a training sequence, moving said part of the training sequence part of a burst relative to said train sequence between cross-correlations.

24. A method according to claim 22, wherein the cross-correlating comprises, for each of said training sequences, repeatedly cross-correlating a part of a burst, greater than the training sequence part of the burst, with a training sequence, moving training sequences relative to said part of a burst between cross-correlations.

25. A method according to claim 22, including tuning the mobile station to a control channel frequency, wherein the received burst is a control channel burst.

26. A method according to claim 22, wherein said slots are contiguous.

27. A method according to claim 26, wherein said slots are all of the slots of a frame.

28. A method comprising:
receiving bursts of data including training sequences at a mobile station;
identifying a training sequence of the bursts in a plurality of slots of a TDMA frame and generating a training sequence identifying signal;
generating a tuning control signal in dependence on said training sequence identifying signal, the generating of the tuning control signal including operating upon a pair of samples of one of said bursts, wherein one sample of said pair of samples of said burst is distant from a second sample of said pair of samples; and
applying the tuning control signal to a tunable reference oscillator in a frequency synthesizer that provides a local oscillator signal to a front end mixer.

29. A method according to claim 28, including tuning the mobile station to a control channel frequency, wherein the received bursts are control channel bursts.

* * * * *